US008049301B2

(12) United States Patent  
Hui

(10) Patent No.: US 8,049,301 B2
(45) Date of Patent: Nov. 1, 2011

(54) SEMICONDUCTOR TRANSFORMERS

(75) Inventor: Shu Yuen Ron Hui, Shatin (HK)

(73) Assignee: City University of Hong Kong, Kowloon (HK)

(*) Notice: Subject to any disclaimer, the term of this patent is extended or adjusted under 35 U.S.C. 154(b) by 13 days.

(21) Appl. No.: 12/441,777

(22) PCT Filed: Sep. 21, 2007

(86) PCT No.: PCT/CN2007/002791
§ 371 (c)(1),
(2), (4) Date: Nov. 18, 2009

(87) PCT Pub. No.: WO2008/040179
PCT Pub. Date: Apr. 10, 2008

(65) Prior Publication Data
US 2010/0078761 A1 Apr. 1, 2010

(30) Foreign Application Priority Data
Sep. 21, 2006 (GB) .................. 0618647.2

(51) Int. Cl.
H01L 29/00 (2006.01)
(52) U.S. Cl. .............. 257/531; 257/528; 361/35
(58) Field of Classification Search .......... 257/531, 257/528; 361/35
See application file for complete search history.

(56) References Cited

U.S. PATENT DOCUMENTS

| 6,501,364 | B1 | 12/2002 | Hui et al. |
| 6,992,871 | B2 | 1/2006 | Ahn et al. |
| 7,034,653 | B2 | 4/2006 | Bhattacharya et al. |
| 7,283,029 | B2 | 10/2007 | Weon et al. |
| 2005/0156699 | A1 | 7/2005 | Hui et al. |

OTHER PUBLICATIONS

Schutten, Michael J., et al., "Ripple Current Cancellation Circuit," Feb. 9-13, 2003, pp. 464-470, vol. 1, Applied Power Electronics Conference and Exposition, IEEE.
Sum, K. Kit, "Improved Valley-Fill Passive Current Shaper," Sep. 1997, pp. 1-8, PowerSystems World '97, Baltimore, MD.
Lam, John, et al., "A New Passive Valley Fill Dimming Electronic Ballast with Extended Line Current Conduction Angle," Sep. 10-14, 2006, pp. 1-7, Telecommunications Energy Conference, Providence, RI.
Hwu, K.I., et al., "A Simple Current-Balancing Converter for LED Lighting," Feb. 15-19, 2009, pp. 587-590, Applied Power Electronics Conference and Exposition.
Hamill, David C., et al., "A 'Zero' Ripple Technique Applicable to Any DC Converter," 1999, pp. 1165-1171, vol. 2, Power Electronics Specialists Conference, Charleston, SC.
Hui, S.Y.R., et al., "A General Photo-Electro-Thermal Theory for Light Emitting Diode (LED) Systems," Feb. 15-19, 2009, pp. 554-562, Applied Power Electronics Conference and Exposition.

(Continued)

Primary Examiner — Long Pham
(74) Attorney, Agent, or Firm — Stites & Harbison PLLC; Douglas E. Jackson

(57) ABSTRACT

A planar transformer structure, which can be constructed in an integrated semiconductor circuit without using traditional metallic windings. To avoid large thermal expansion of metallic spiral windings and associated mechanical stress on a metal-semiconductor interface, it is suggested that highly doped semiconductor materials with or without silicides and salicides can be used to form windings or conducting paths because their thermal expansion coefficients are similar to that of semiconductor material. The planar semiconductor transformer may find application for low-power and signal transfer that needs electrical isolation.

8 Claims, 6 Drawing Sheets

OTHER PUBLICATIONS

Chung, Henry Shu-Hung, et al., "Comparison of Dimmable Electromagnetic and Electronic Ballast Systems—An Assessment on Energy Efficiency and Lifetime," Dec. 2007, pp. 3145-3154, vol. 54, No. 6, Industrial Electronics, IEEE Transactions.

Dos Reis, F.S., et al., "Single Stage Ballast for High Pressure Sodium Lamps," Nov. 2-6, 2004, pp. 2888-2893, vol. 3, Industrial Electronics Society.

Qian, Jinrong, et al., "A High Efficient Single Stage Single Switch High Power Factor AC/DC Converter with Universal Input," Feb. 23-27, 1997, pp. 281-287, vol. 1, Applied Power Electronics Conference and Exposition, Atlanta, GA.

Qiao, Chongming, et al., "A Topology Survey of Single-Stage Power Factor Corrector with a Boost Type Input-Current-Shaper," May 2001, pp. 360-368, vol. 16, No. 3, Power Electronics, IEEE Transactions.

Tse, C.K., et al., "Single Stage High Power Factor Converter Using the Sheppard-Taylor Topology," Jun. 23-27, 1996, pp. 1191-1197, vol. 2, Power Electronics Specialists Conference, Baveno, Italy.

Hui, S.Y.R., et al., "Re-examination on Energy Saving & Environmental Issues in Lighting Applications," Department of Electronic Engineering, City University of Hong Kong.

SEMICONDUCTOR TRANSFORMERS

FIELD OF THE INVENTION

This invention relates to novel transformer structures, and in particular to transformers formed of semiconductor materials.

BACKGROUND OF THE INVENTION

Traditional transformers are "electromagnetic devices" because each of them consists of a magnetic core and copper windings and so the structure of the core is magnetic in nature. In general, transformers are located in circuit boards as separate components and cannot be integrated into semiconductor based integrated circuits. The recent development of coreless planar transformers [see references 1-6] and their operating principles has opened a door to the construction of non-magnetic coreless planar transformers and such coreless planar transformers have been implemented into printed-circuit-boards (PCBs) for a range of power and signal transfer applications [see references 7-11].

PRIOR ART

An industrial adoption of a coreless planar transformer gate-drive concept has been demonstrated by Infineon [reference 12] in the design of an integrated circuit for electronic ballast control. However, to date all the ideas and proposed applications of the coreless planar transformer concept use metallic conductors for the primary and secondary windings. Thus, the coreless planar transformer concept is still restricted by the use of metallic conductors as the base for the transformer windings, and although a method of integrating magnetic components such as transformers and inductors into semiconductor circuits has been proposed [15], the deposit of metallic materials on semiconductor (and the requirement of a metal-semiconductor interface) is a costly, difficult and complicated process. Furthermore, in the case of [12], the structure consists of two metallic spiral windings deposited on two opposite sides of an insulated semiconductor substrate (silicon dioxide). Unlike semiconductor switches in which the current flows vertically through a short length of semiconductor materials, the planar transformer has at least two spiral windings with a significant length for the current to pass through along the plane of the windings. Typical metals that can be used as spiral windings on semiconductor surface are aluminum and copper. It will be understood that the thermal expansion coefficients of aluminum, copper and silicon are 23 ($\times 10^{-6} K^{-1}$), 17 ($\times 10^{-6} K^{-1}$) and 2.6 ($\times 10^{-6} K^{-1}$), respectively. So aluminum tracks and copper tracks will expand 8.8 times and 6.5 times larger than semiconductor materials, respectively. This huge difference in thermal expansion coefficients can result in high mechanical stress on the metal-semiconductor interface and the metallic tracks can easily break away from the interface under thermal expansion.

SUMMARY OF THE INVENTION

According to the present invention there is provided a transformer wherein the primary and secondary windings comprise highly doped conducting paths in a semiconductor material.

In a preferred embodiment of the invention the primary and secondary windings may be provided as highly doped conducting paths on opposed sides of an insulating substrate. Preferably the insulating substrate may be silicon dioxide, and the conducting paths may be highly doped silicon.

The highly doped conducting paths may include silicides or salicides in order to increase the conductivity of the tracks without substantially increasing the thermal expansion coefficients.

The highly doped conducting paths may be formed in silicon-on-insulator layer. For example, in an embodiment of the invention the primary winding may be formed in a first silicon-on-insulator layer, the secondary winding may be formed in a second silicon-on-insulator layer, and the first and second silicon-on-insulator layers are bonded together such that the two insulator layers are bonded to each other to form an insulating layer between the primary and secondary windings.

BRIEF DESCRIPTION OF THE DRAWINGS

Some embodiments of the invention will now be described by way of example and with reference to the accompanying drawings, in which:—

DETAILED DESCRIPTION OF PREFERRED EMBODIMENTS

In existing electronic circuits, magnetic transformers with magnetic cores are usually used as separate components in a circuit board. Despite the recent development of integrated magnetics, these magnetic components are still treated as individual (or discrete) components in circuit constructions and cannot be integrated into semiconductor integrated electronic circuits. As will be seen from the following description of preferred embodiments of the invention, this invention is concerned with a "semiconductor transformer" concept in which all (or at least substantially all) parts of the transformer are made of semiconductor materials and can therefore be fully incorporated into integrated semiconductor electronic circuits (more simply called integrated circuits).

In preferred embodiments of the present invention the windings are made of highly doped semiconductor paths. This proposal changes the conventional concept of "magnetic" transformers to "semiconductor" transformers for easy integrated circuit fabrication and total circuit integration. The benefits arising from this invention include the possibility of full circuit integration; reduction in manufacturing costs, stray components and circuit noise; improvement in power density and system compactness. Furthermore, forming the conducting paths of highly doped semiconductor material reduces the problems that result from widely differing coefficients of thermal expansion that occur when conductive metal tracks are used.

As will be seen from the following, preferred embodiments of the invention provide a new semiconductor transformer concept in which the entire transformer structure can be fabricated with semiconductor materials. This structure is illustrated below with an example of this type of semiconductor transformers and the basic characteristics of the transformer are described. With this new concept of semiconductors, transformers that can provide electrical isolation, power and/or signal transfer can be integrated into electronic circuits in the semiconductor manufacturing process. In particular, the transformer and other electronic circuits can be fabricated integrally in a monolithic manner using conventional semiconductor fabrication techniques.

Figure 1:
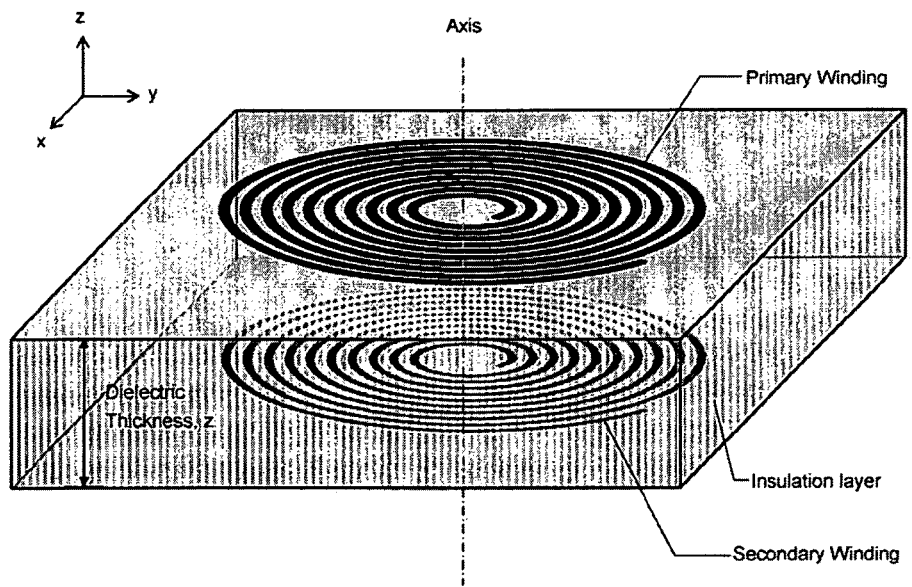
FIG. 1 is a perspective view of a transformer according to an embodiment of the invention.

FIG. 1 shows an embodiment of the invention in the form of a planar coreless transformer that can be fabricated using semiconductor materials. In this embodiment the primary winding 1 and the secondary winding 2 are both formed of highly doped semiconductor materials so that they behave like good conducting paths with low resistance. The highly doped conducting paths can be p+ type or n+ type depending on the design and manufacturing process requirements, and it will be understood that the windings can be formed by any conventional semiconductor doping techniques. In this embodiment, a highly doped material (such as n+) is used as the conducting path. The insulation layer between the two planar conducting paths can be made of highly resistive materials with low dielectric constant (or also called relative permittivity) such as semiconductor oxide (e.g. silicon oxide, germanium oxide). The electrical breakdown voltage of the insulation layer is dependent on the thickness of the oxide layer.

In order to avoid huge mechanical stress between the windings and the substrate, the windings and the substrate can be made of materials with similar thermal expansion coefficients. The types of winding materials depend on the requirement of the planar transformers.

For signal transmission purposes without involving power transfer, planar windings with a thickness less than a few microns can be used. In this case, the primary and secondary "windings" can be made of highly doped semiconductor materials so that they behave like good conducting paths with low resistance. The highly doped conducting paths can be p++ type or n++ type depending on the design and manufacturing process requirements. The two planar semiconductor windings are separated by an insulation substrate such as silicon dioxide.

An alternative method of making the highly doped semiconductor windings is to deposit doped polysilicon materials to form the windings. In order to further reduce the resistance of the semiconductor windings, electrically conductive silicides such as $Cu_5Si$, $(V,Cr,Mn)_3Si$, $Fe_3Si$, $Mn_3Si$ can also be used. Silicides contain metal atoms which increase the conductivity of the semiconductor windings without increasing the thermal expansion coefficients substantially. Silicide prepared by a self-aligned process is called salicide. This is a process in which silicide contacts are formed only in those areas in which deposited metal (which after annealing becomes a metal component of the silicide) is in direct contact with silicon, hence, the process is self-aligned. It is commonly implemented in MOS/CMOS processes for ohmic contacts of the source, drain, and poly-Si gate. So salicides can be used to increase the conductivity of the semiconductor windings.

For applications in which both power and signal transfer are required, semiconductor tracks with greater thickness are needed. To obtain a thickness of tens of microns, the silicon-on-insulator (SOI) approach can be used. For a particular kind of SOI (called bonded SOI), two pieces of silicon wafers can be bonded together with the bonding face(s) of the wafer(s) pre-oxidized or -deposited with silicon dioxide. In this way, it is possible to have hundreds of microns of silicon on both sides of the interfacial oxide, which is the planar semiconductor structure proposed for use in embodiments of this invention. Since the interfacial oxide is pre-oxidized or -deposited prior to the wafer bonding, it can be a few microns thick. After this structure is formed, one can start to use photolithography to pattern the silicon on both side of the silicon dioxide to form the primary and secondary windings of planar transformer. Of course, the silicon should have heavily doped impurities (N++ or P++) to obtain a very low resistivity as close as possible to the metallic windings to be replaced.

Figure 2:
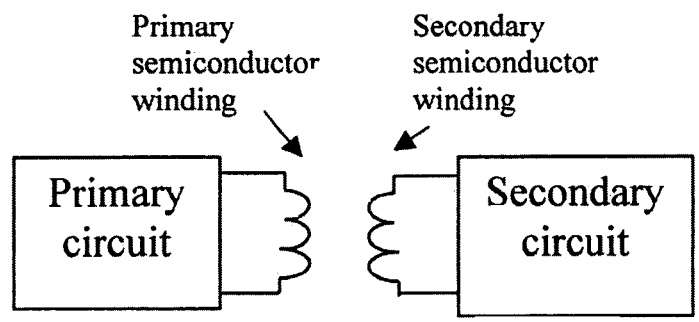
FIG. 2 is a schematic diagram showing a transformer isolated circuit.
Figure 3A:
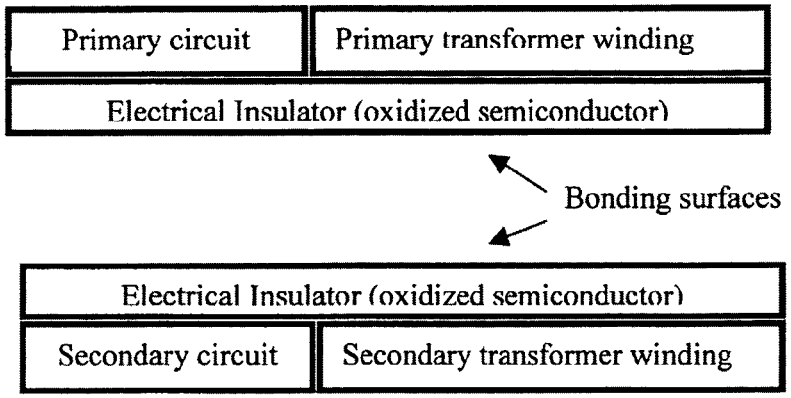
FIGS. 3(a)-(c) illustrate SOI fabrication of embodiments of the invention.
Figure 3B:
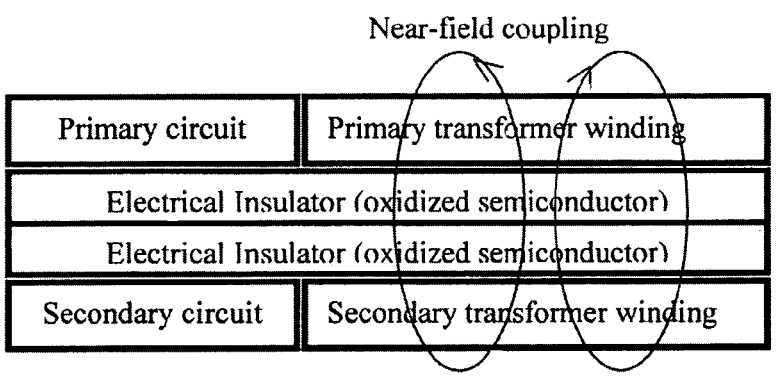
Figure 3C:
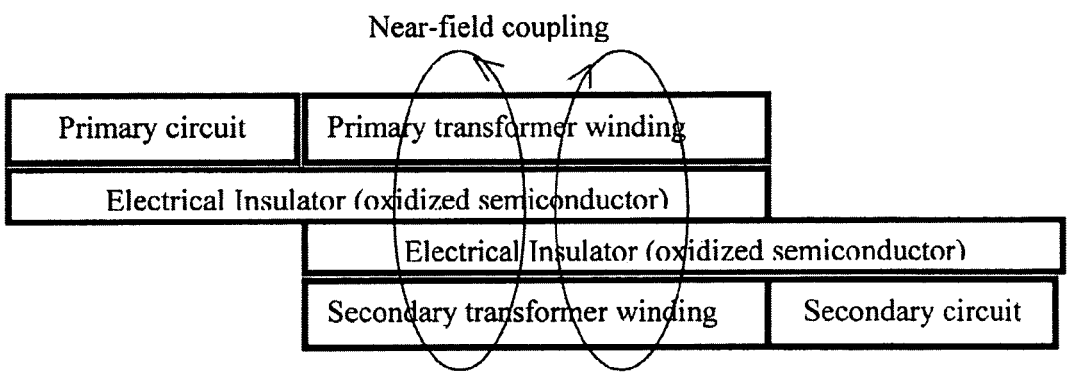

Taking the electrically isolated gate drive circuits for power mosfets and insulated gate bipolar transistors (IGBT) [8-11] as an example, the transformer isolated circuit can be simplified as shown in FIG. 2. Using the SOI approach, the primary and secondary circuit including their respectively semiconductor windings can be fabricated separately (FIG. 3a) and then bonded together as shown in FIG. 3b and FIG. 3c.

An embodiment of the invention may be described by way of example to demonstrate the characteristics of the semiconductor transformers. In this example, a highly doped material (such as N++) is used as the conducting path. The insulation layer between the two planar conducting paths can be made of highly resistive materials with low dielectric constant (or also called relative permittivity) such as metal oxide (e.g. silicon oxide). The electrical breakdown voltage of the insulation layer is dependent of the thickness of the oxide layer.

This transformer has the following particular features.

The winding resistance depends on the doping level of the conducting paths. The conductivity of any material depends on its free carrier density. The carrier densities of insulator and conductor are typically $10^3$ $cm^{-3}$ and $10^{23}$ $cm^{-3}$, respectively. The carrier density of a pure semiconductor is typically $10^{13}$ $cm^{-3}$. With modern technology, highly doped semiconductor materials can achieve a carrier density of $10^{21}$ $cm^{-3}$ which is very close to that of a conductor. The semiconductor winding resistance can be further reduced by using electrically conductive silicides or salicides which contain metal atoms that increase conductivity without substantially increasing the thermal expansion coefficients.

The capacitance between the primary and secondary windings depends on the dielectric constant of the insulation material. If silicon dioxide $SiO_2$ (for example) is used as the insulation, it has a low relative permittivity of 3.9 [see reference 14], resulting in very low interwinding capacitance between the primary and secondary windings. Such low interwinding capacitance reduces noise and interference due to switching transients.

Semiconductor oxides generally have a high breakdown voltage. For example, silicon dioxide has high breakdown field voltage of 600V/μm, allowing it to provide high electrical insulation for the semiconductor transformer.

The mutual inductance of the primary and secondary windings depends on the geometry of the winding structure. The closer the windings are, the higher the magnetic coupling coefficient becomes. Since the insulation layer (e.g. $SiO_2$) can be made very thin (e.g. 6000V for 10 microns of $SiO_2$), a high magnetic coupling coefficient between the coupled primary and secondary windings can be provided.

A significant advantage provided by embodiments of the invention is the possibility of integrating the entire circuit into one package. For example, a switched mode power supply with electrical isolated output can be fabricated into one integrated circuit without using external core-based transformers. Such possibility of full circuit integration can reduce stray components in the circuits, resulting in a possibility of reducing circuit transients and increasing operating speed.

The characteristics of a transformer constructed according to an embodiment of the present invention may be illustrated in the following example. The results are obtained by using Ansoft finite-element simulation software that has been shown to be accurate in this type of study [1-11]. It is important to note that the characteristics of the semiconductor transformers are very similar to those of coreless planar transformers demonstrated in coreless printed-circuit-board (PCB) transformers in references [1-11]. In particular, it can be seen that the maximum impedance frequency is found to be lower than the resonant frequency of the transformer circuit.

Figure 4:
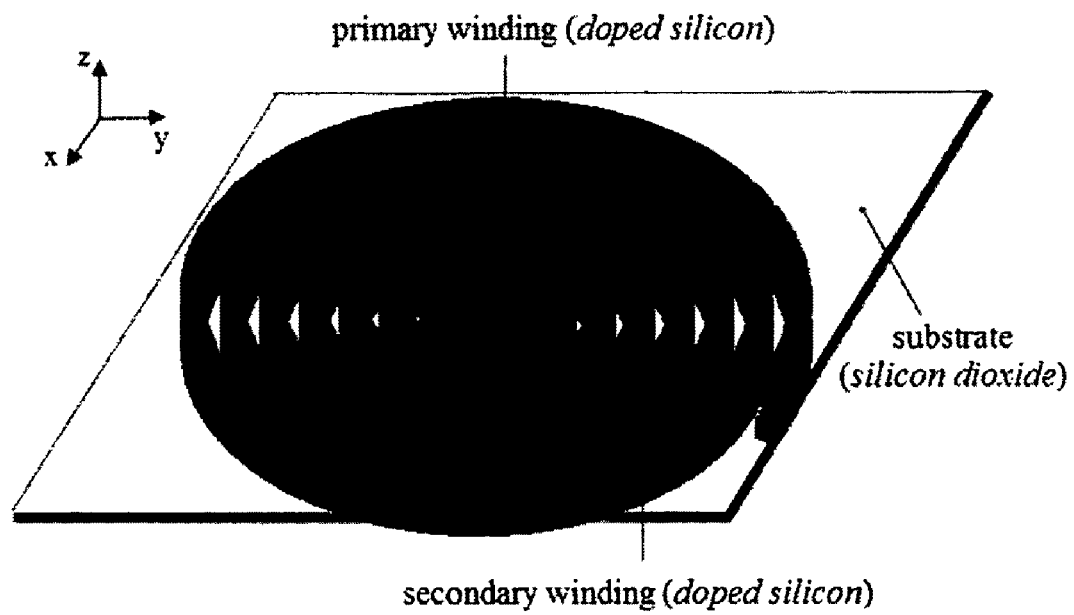
FIG. 4 shows a 3-D model of a transformer for use in a simulation of an embodiment of the invention.

The 3-D model used in the finite-element (FE) simulation is shown in FIG. 4. The primary winding and the secondary winding are fabricated from highly doped semiconductor materials (which can be either P++ or N++ type) on each side of the substrate which acts as the insulation layer. Silicon oxide is used as the insulation in this example. For the sake of clarity, the insulation substrate is redrawn as a transparent plate in this figure.

The parameters of this example are:
The outer-diameter of both the primary and secondary windings is 6 mm.
The number of turns is 7.
The primary and secondary windings are identical and are placed directly on the opposite sides of the insulation substrate.
The thickness of insulation layer is 20 μm, providing a breakdown voltage of 12 kV. (The breakdown voltage of silicon dioxide is 600 V/μm.)
The track width is 0.22 mm.
The track height is 0.5 mm.
The spacing between the tracks is 0.14 mm.
The primary and the secondary windings (highly doped conducting tracks) are both made of heavily doped silicon (with carrier density around $10^{+21}$ $cm^{-3}$) with a conductivity of $1 \times 10^6$ S/m.

Figure 5:
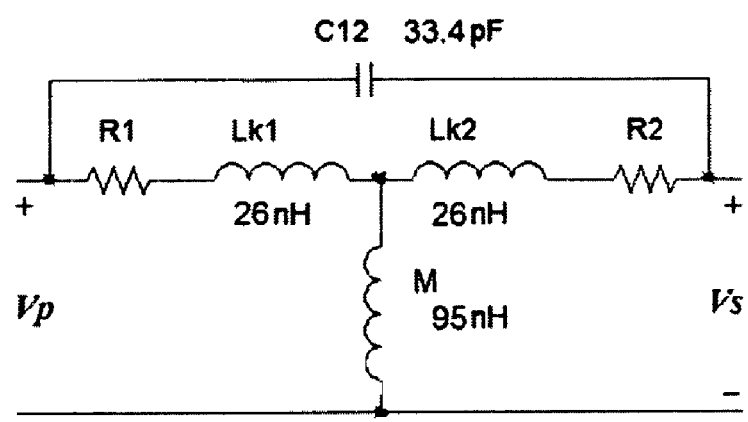
FIG. 5 shows the transformer equivalent circuit.

Based on these parameters, the transformer model parameters are obtained from the 3-dimensional finite-element simulation using the Ansoft simulation package. The transformer circuit model is shown in FIG. 5.

The values of inductance L1 and L2 of the primary and secondary windings, respectively, are acquired from Finite-Element simulation. Due to the fact that very thin silicon dioxide of 20 μm is used as substrate, the mutual coupling coefficient ($k=M/\sqrt{L_1 L_2}$) between the primary and secondary winding is found to be fairly high (k=0.785), where M is the mutual inductance and k is the mutual coupling coefficient.

Figure 6:
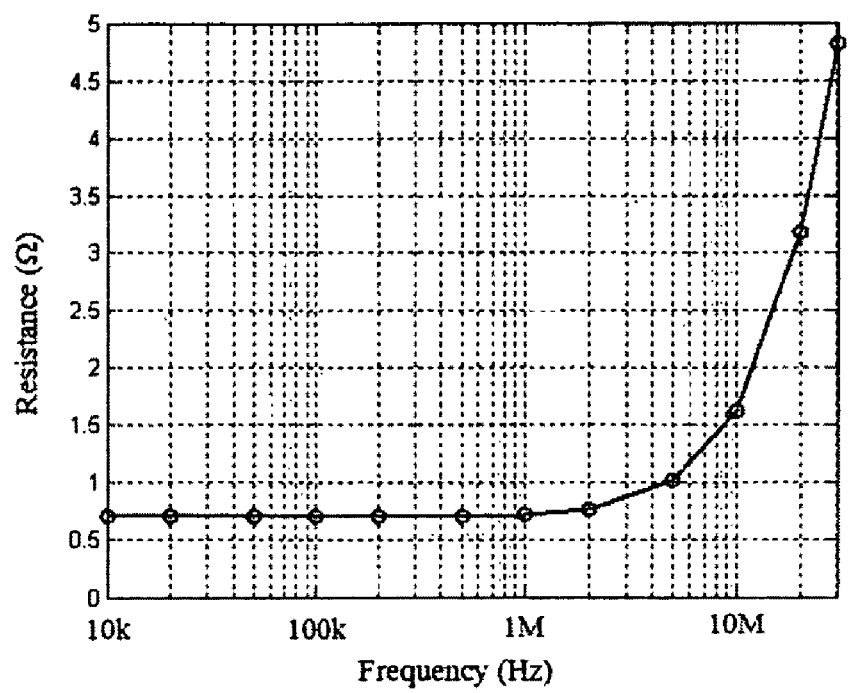
FIG. 6 is a plot showing the resistance of semiconductor windings as a function of operating frequency.

Like metallic conductors, the AC resistance of the highly doped conducting tracks depends on the operating frequency due to skin effect and proximity effect. The resistances of the windings, R1 and R2, increase from 0.715Ω at DC operation, to 0.728Ω at 1 MHz, 1.62Ω at 10 MHz and 3.18Ω at 20 MHz. FIG. 4 shows the variation of the AC resistance of the highly doped conduction tracks with operating frequency. This characteristic is similar to that of a metallic conductor. It can be seen from FIG. 6 that typical resistance of sub-Ohm or less than a few Ohms (depending on operating frequency) in the "semiconductor windings" is acceptable in many low-power applications.

C12 represents the capacitance between the two windings. It must be stressed that this capacitance value can be further reduced by using a thicker insulation layer. This capacitance C12 is inversely proportional to the distance between the planes of the two windings as shown in the following equation:

$$C_{12} = \frac{\varepsilon_r \varepsilon_o A}{d}$$

where $\varepsilon_r$ is the relative permittivity, $\varepsilon_0$ is the permittivity for free space ($\varepsilon_0 = 8.86 \times 10^{-14}$ F/cm), A is the area of the winding plate and d is the distance between the two winding plates.

In this study (that is similar to the coreless planar transformer study in [2-8]), the secondary winding is loaded with a resistor of 2 kΩ in parallel with a capacitor of 680 pF and the primary winding is excited with an ac sinusoidal voltage source of 10V within a wide frequency range.

The no-load resonant frequency of the equivalent circuit is given by $$f_o = \frac{1}{2\pi \sqrt{L_{eq} C_{eq}}}$$

where $L_{eq} = L'_{lk2} + L_{lk1} \| L_{M1}$ and $C_{eq} = C + +C'_2 + C'_{12}$. (Here $C_2'$ includes the load capacitance.)

Figure 7:
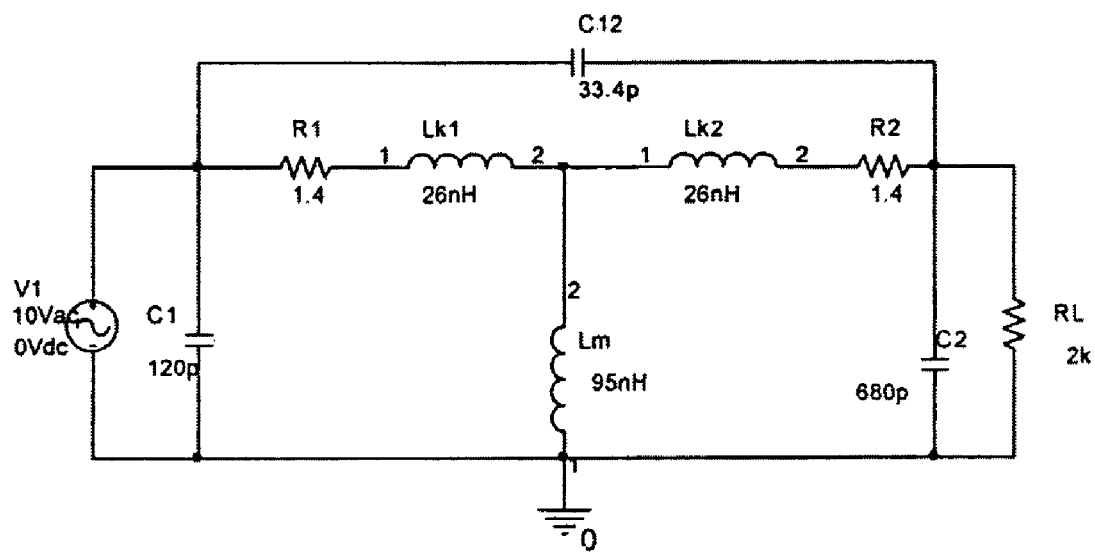
FIG. 7 shows the equivalent circuit of a transformer according to an embodiment of the invention under test with a capacitive-resistive load.

Based on the operating principles of coreless planar transformers described in [1-11], tests have been carried out to evaluate the characteristics of the semiconductor transformer. The test circuit (including the transformer equivalent circuit, the capacitive and resistive load and the ac voltage source) is shown in FIG. 7. C1 and C2 are two externally connected capacitors and RL is the load resistor.

Figure 8:
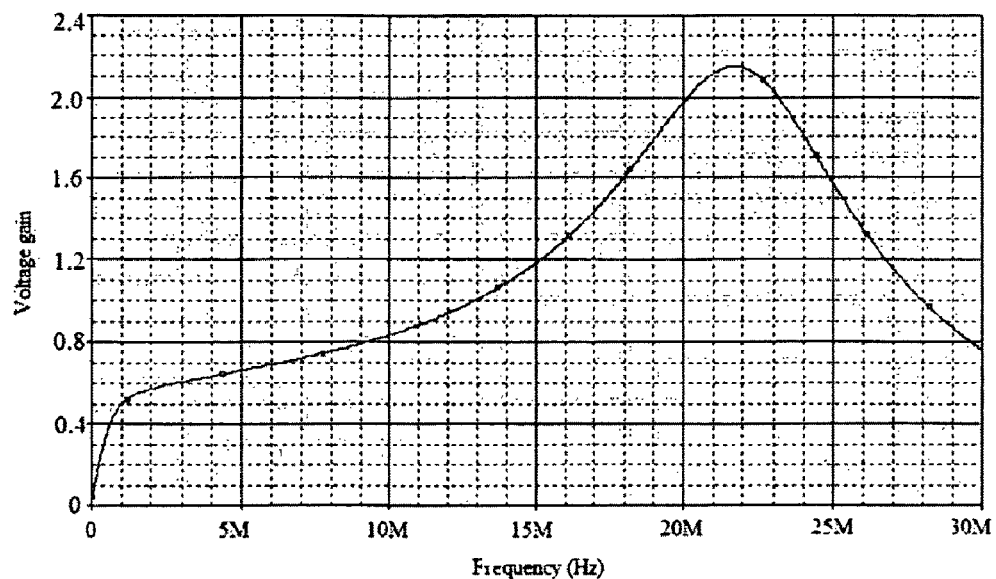
FIG. 8 is a plot showing a typical voltage gain characteristic of a semiconductor transformer according to an embodiment of the invention.
Figure 9:
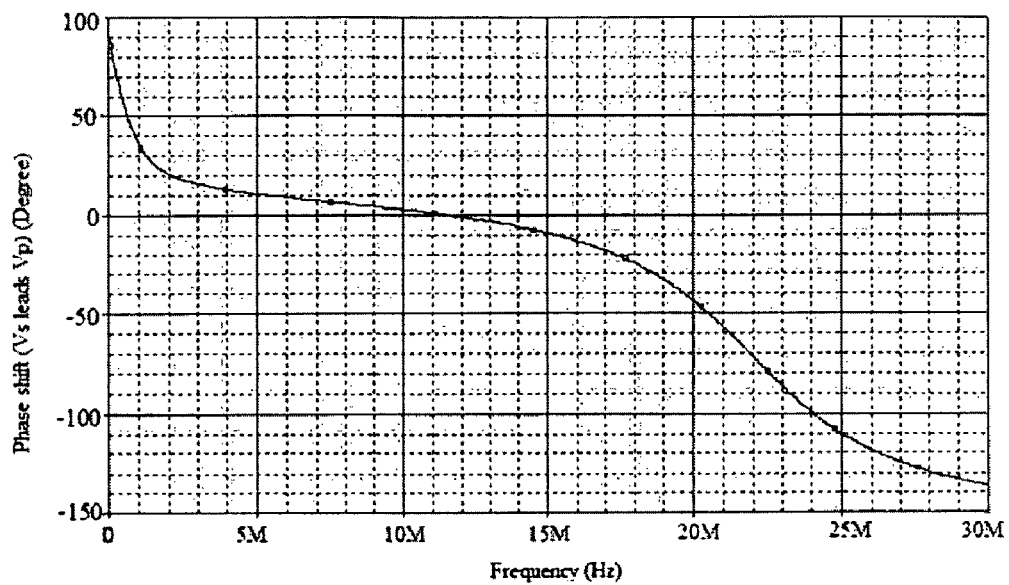
FIG. 9 is a plot showing the phase shift as a function of operating frequency for a semiconductor transformer according to an embodiment of the invention.

Typical frequency response of a device includes (i) the voltage gain and (ii) phase plot as functions of operating frequency. FIG. 8 shows the voltage gain characteristic of the semiconductor transformer up to a frequency range of 30 MHz. As expected from a circuit consisting of inductors and capacitors, resonance occurs at a certain frequency. In this example, the resonant frequency occurs at about 21.7 MHz. The corresponding phase plot is shown in FIG. 9. It can be seen that the frequency response of the semiconductor transformer is similar to that of other coreless planar transformers [2-8].

Figure 10:
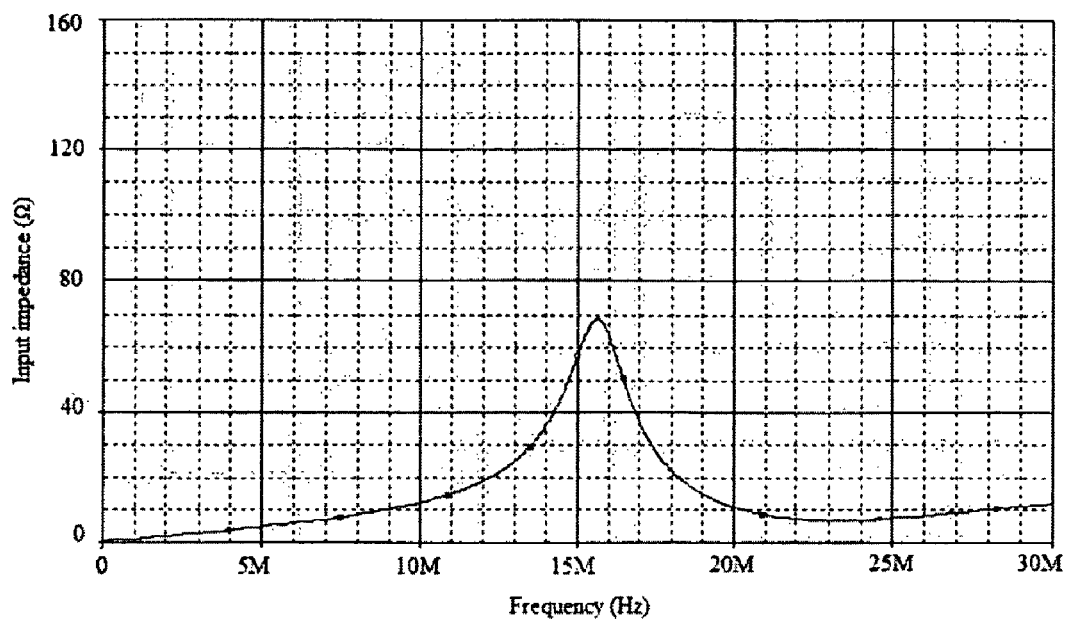
FIG. 10 is a plot showing variation of input impedance as a function of operating frequency for the equivalent circuit of FIG. 7.
Figure 11:
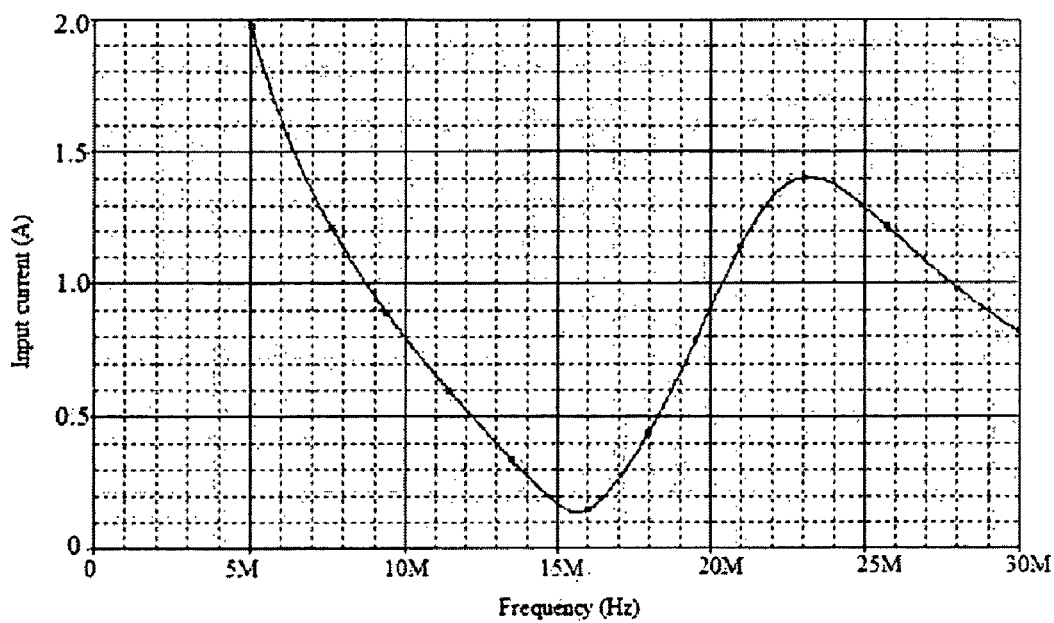
FIG. 11 is a plot showing variation of input current as a function of operating frequency for the equivalent circuit of FIG. 7.

The input current of the entire equivalent circuit of FIG. 7 is obtained in order to work out the input impedance of the equivalent circuit. FIG. 10 shows the variation of the input impedance of the equivalent circuit. The corresponding input current is shown in FIG. 11. It is important to note from FIG. 10 and FIG. 11 that A maximum input impedance of about 70 Ohm occurs at about 15.7 MHz.
This "maximum impedance frequency" of 15.7 MHz is less than the resonant frequency of 21.7 MHz, as discovered in [2-8] for coreless planar transformers.

At the "maximum impedance frequency", the equivalent circuit does not behave like a short circuit and therefore the semiconductor transformer can be used as a transformer.

At the maximum impedance frequency, the input current can be minimized (about 0.15 A) as shown in FIG. 11. This confirms that the maximum impedance frequency (or around this frequency) is the optimal operating frequency for the semiconductor transformer if power consumption of the transformer has to be minimized.

From the above example it can be seen that if highly doped conducting paths are employed as "semiconductor windings" in the transformer structure to replace the metallic windings, then the whole fabrication process can be done with semiconductor materials only. This semiconductor transformer then allows electronic circuits (such as switched mode power electronic circuits) that need transformers for electrical isolation, voltage step-up or step-down, power and/or signal transfer to be fabricated in a single semiconductor integrated circuit. In this way, the power density and ease of large-scale manufacturing of the electronic circuits can be greatly improved. In addition, total integration of electronic circuits (e.g. power electronic circuit, control circuit and digital controller circuit) can be realized. Adverse effects due to stray components can therefore be minimized.

Although one use of the semiconductor transformer is to keep the resistance of the highly doped semiconductor windings as low as possible, the resistance of the semiconductor windings can be controlled [reference 13] so that the winding resistance can play a part in deciding the resonant frequency of the semiconductor transformer structure.

It will be understood by those skilled in the art that there are a number of ways in which a semiconductor transformer as described above may be fabricated. For example, silicon may be deposited on both sides of a silicon dioxide substrate prior to the formation of the conducting paths, which may then be carried out by ion implantation doping. Subsequent to the formation of the conducting paths silicon remaining between turns of the winding may then be oxidized to form insulation silicon dioxide. An alternative way is to dope the winding on a layer of semiconductor material. Then deposit a layer of semiconductor oxide as the substrate. On top of this substrate a layer of semiconductor is deposited. Finally, the other winding is formed by doping the top semiconductor layer.

The following references are incorporated herein:
1. Hui S. Y. R. and Tang S. C., 'Planar printed-circuit-board transformers with effective electromagnetic interference (EMI) shielding', U.S. Pat. No. 6,501,364 (31 Dec. 2002)
2. EP(GB)0935263B Method of Operating a Coreless Printed-Circuit-Board (PCB) Transformer (UK)
3. DE69917504.6-08 Method of Operating a Coreless Printed-Circuit-Board (PCB) Transformer (Germany)
4. ZL99100579.1 Coreless PCB-based Transformers (People Republic of China)
5. Hui S. Y. R. and Tang S. C., 'Coreless printed-circuit-board (PCB) transformers', U.S. patent application Ser. No. 08/018,871 (filed December 1998)
6. Hui S. Y. R. and Tang S. C., 'Coreless Printed-circuit board (PCB) transformers and operating techniques' U.S. patent application Ser. No. 09/316,735 (filed May 1999)
7. Hui, S. Y. R.; Tang, S. C.; Chung, H., 'Coreless printed-circuit board transformers for signal and energy transfer', *Electronics Letters*, Volume: 34 Issue: 11, 28 May 1998, Page(s): 1052-1054
8. Hui, S. Y. R.; Henry Shu-Hung Chung; Tang, S. C., 'Coreless printed circuit board (PCB) transformers for power MOSFET/IGBT gate drive circuits', *IEEE Transactions on Power Electronics*, Volume: 14 Issue: 3, May 1999, Page (s): 422-430
9. Tang, S. C.; Hui, S. Y. R.; Henry Shu-Hung Chung, 'Coreless printed circuit board (PCB) transformers with multiple secondary windings for complementary gate drive circuits', *IEEE Transactions on Power Electronics*, Volume: 14 Issue: 3, May 1999, Page(s): 431-437
10. Hui, S. Y. R.; Tang, S. C.; Henry Shu-Hung Chung, 'Optimal operation of coreless PCB transformer-isolated gate drive circuits with wide switching frequency range', *IEEE Transactions on Power Electronics*, Volume: 14 Issue: 3, May 1999, Page(s): 506-514
11. Tang, S. C.; Hui, S. Y. R.; Henry Shu-Hung Chung, 'Careless planar printed-circuit-board (PCB) transformers-a fundamental concept for signal and energy transfer', *IEEE Transactions on Power Electronics*, Volume: 15 Issue: 5, September 2000, Page(s): 931-941
12. M. Munzer, W. Ademmer, B. Strzalkowski and K. T. Kaschani, "Coreless transformers—a new technology for half-Obridge driver IC's", Infineon Technical Paper (attached).
13. "Semiconductor resistor", U.S. Pat. No. 7,034,653, April 2006
14. Andres G. Fortino, "Fundamentals of Integrated Circuit Technology", Reston Publishing Company, 1984 ISBN 0-8359-2135-2
15. W DAEHEE; MOHAMMADI SAEED; JEON JONG-HYEOK; KATEHI LINDA, "3-D transformer for high frequency applications" Patent application WO2006063193

The invention claimed is:

1. A transformer wherein the primary and secondary windings comprise highly doped conducting paths of a semiconductor material.

2. A transformer as claimed in claim 1 wherein the primary and secondary windings include silicides.

3. A transformer as claimed in claim 1 wherein the primary and secondary windings include salicides.

4. A transformer as claimed in claim 1 wherein the primary and secondary windings are formed as highly doped conducting paths on opposed sides of an insulating substrate.

5. A transformer as claimed in claim 4 wherein the insulating substrate is silicon dioxide and the conducting paths are highly doped silicon.

6. A transformer as claimed in claim 1 wherein the primary winding is formed in a silicon-on-insulator layer.

7. A transformer as claimed in claim 1 wherein the secondary winding is formed in a silicon-on-insulator layer.

8. A transformer as claimed in claim 1 wherein the primary winding is formed in a first silicon-on-insulator layer, the secondary winding is formed in a second silicon-on-insulator layer, and wherein the first and second silicon-on-insulator layers are bonded together.

* * * * *